(12) United States Patent
Hirohisa (10) Patent No.: US 6,198,673 B1
(45) Date of Patent: Mar. 6, 2001

(54) SEMICONDUCTOR INTEGRATED CIRCUIT HAVING A UNIT CELL INCLUDING NMOS AND PMOS TRANSISTORS

(75) Inventor: Masuda Hirohisa, Tokyo (JP)

(73) Assignee: Oki Electric Industry Co., LTD, Tokyo (JP)

( * ) Notice: Subject to any disclaimer, the term of this patent is extended or adjusted under 35 U.S.C. 154(b) by 0 days.

(21) Appl. No.: 09/321,532

(22) Filed: May 28, 1999

(30) Foreign Application Priority Data

May 29, 1998 (JP) .................................................. 10-149549

(51) Int. Cl.[7] ................................. G11C 7/00; G06F 1/04
(52) U.S. Cl. ..................... 365/189.11; 365/233; 327/291; 327/299
(58) Field of Search ..................................... 326/102, 103; 327/291, 299; 365/233, 189.11

(56) References Cited

U.S. PATENT DOCUMENTS 5,764,089 * 6/1998 Partovi et al. ........................ 327/200
5,771,201 * 6/1998 Cho ....................................... 365/233
5,854,567 * 12/1998 Meier et al. .......................... 327/437

* cited by examiner

*Primary Examiner*—Son Mai
(74) *Attorney, Agent, or Firm*—Jones Volentine, L.L.C.

(57) ABSTRACT

A semiconductor integrated circuit having a core region and an I/O region includes a clock signal line for transferring a clock signal, basic unit cells and pull-up unit cells. The basic unit cells are arranged in rows and columns within the core region. Each of the basic unit cells has a PMOS active region and an NMOS active region. The pull-up unit cells are arranged at predetermined intervals between the basic unit cells. The pull-up unit cells are coupled to the signal line for pulling up an electric level of the clock signal line in response to the clock signal.

20 Claims, 12 Drawing Sheets

⊠ : CONTACT

▢ : FIRST THROUGH HOLE

▧ : POLY SILICON CONDUCTIVE LINE

▨ : FIRST LAYER METAL LINE

▒ : SECOND LAYER METAL LINE

SEMICONDUCTOR INTEGRATED CIRCUIT HAVING A UNIT CELL INCLUDING NMOS AND PMOS TRANSISTORS

BACKGROUND OF THE INVENTION

1. Field of the Invention

This invention relates to a semiconductor integrated circuit, and particularly to a semiconductor integrated circuit such as SOG (Sea Of Gate), wherein unit cells with basic circuits formed therein are formed in a core area of a semiconductor chip in row and column form.

2. Description of the Related Art

In a conventional semiconductor integrated circuit such as SOG or the like, a high-driven driver is inserted between unit cells to control the time required to transfer a signal between the unit cells when a designer designs circuitry. However, no particular countermeasures were taken against its control on a hardware basis.

With miniaturization of semiconductor devices employed in a recent semiconductor integrated circuit devices, however, the proportion of a pass delay to signal increases from a delay time of a signal transmitted through a conventional semiconductor device, e.g., a transistor element itself to a delay time of a signal, which is developed between unit cells due to interconnections.

Therefore, there has been need to take countermeasures for adjusting the time required to transfer the signal between the unit cells.

SUMMARY OF THE INVENTION

With the foregoing in view, it is therefore an object of the present invention to provide a semiconductor integrated circuit capable of adjusting the time required to transfer a signal between unit cells.

For achieving the above object, a semiconductor integrated circuit having a core region and an I/O region according to the present invention comprises, a clock signal line for transferring a clock signal, basic unit cells and pull-up unit cells. The basic unit cells are arranged in rows and columns within the core region. Each of the basic unit cells has a PMOS active region and an NMOS active region. The pull-up unit cells are arranged in predetermined intervals between the basic unit cells. The pull-up unit cells are coupled to the signal line for pulling up an electric level of the clock signal line in response to the clock signal.

Typical ones of various inventions of the present application have been shown in brief. However, the various inventions of the present application and specific configurations of these inventions will be understood from the following description.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following descripi taken in connection with the accompanying drawings in which:

FIG. 6 consisting of FIGS. 6A–6C is an explanatory view depicting one example of the layout of the pull-up unit cell having the circu configuration shown in FIG. 3;

FIG. 7 consisting of FIGS. 7A–7C is an explnatory view showing another example of the layout of the pull-up unit cell havin the circuit configuration shown in FIG. 3;

FIG. 8 consisting pf

FIG. 12 consisting of FIGS. 12A–12D is an explanatory view depicting one example of the layout of the pull-up/pull-down unit cell having the circuit configuration shown in FIG. 11;

FIG. 13 consisting of FIGS. 13A–13C is an explanatory view showing another example of the layout of the pull-up/pull-down unit cell having the circuit configuration shown in FIG. 11;

FIG. 14 consisting 14A–14B is an explanatory view illustrating an effect obtained from the first embodiment othe present invention; and FIG. 15 consisting of FIGS. 15A–15B is an explanatory view depicting an effect obtained from a second embodiment of the present invention.

DETAILED DESCRIPTION OF THE PREFERRED EMBODIMENTS

Figure 1:
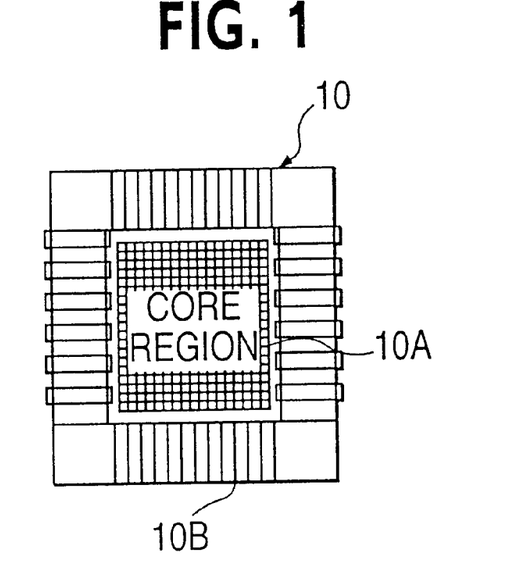
FIG. 1 is a plan view showing a fragmentary configuration of a semiconductor iitegrated circuit device according to a first embodiment of the present invention.
Figure 2:
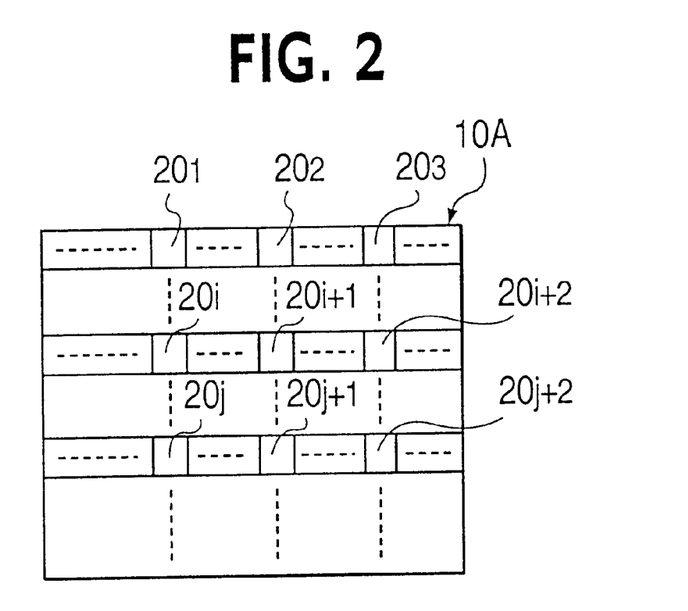
FIG. 2 is an explanatory view illustrating a state of an arrangement of pull-up unit cells, placed in a core area shown in FIG. 1.

Preferred embodiments of the present invention will hereinafter be described in detail with reference to the accompanying drawings. FIGS. 1 and 2 respectively show a fragmentary configuration of a semiconductor integrated circuit device according to a first embodiment of the present invention. In FIG. 1, a semiconductor chip 10, which constitutes the semiconductor integrated circuit device according to the first embodiment of the present invention, has a core area 10A in which unit cells each having a basic circuit formed therein are arranged in row and column form, and an I/O area 10B which is formed around the core area 10A and in which I/O (input/output) cells are placed. As shown in FIG. 2, a plurality of pull-up unit cells $20_1$, $20_2$, $20_3$, $20_i$, $20_{i+1}$, $20_{i+2}$, $20_j$, $20_{j+1}$, $20_{j+2}$, . . . are formed in the core area 10A in row and column directions at predetermined intervals in addition to the normal unit cells with the basic circuits formed therein.

Figure 3:
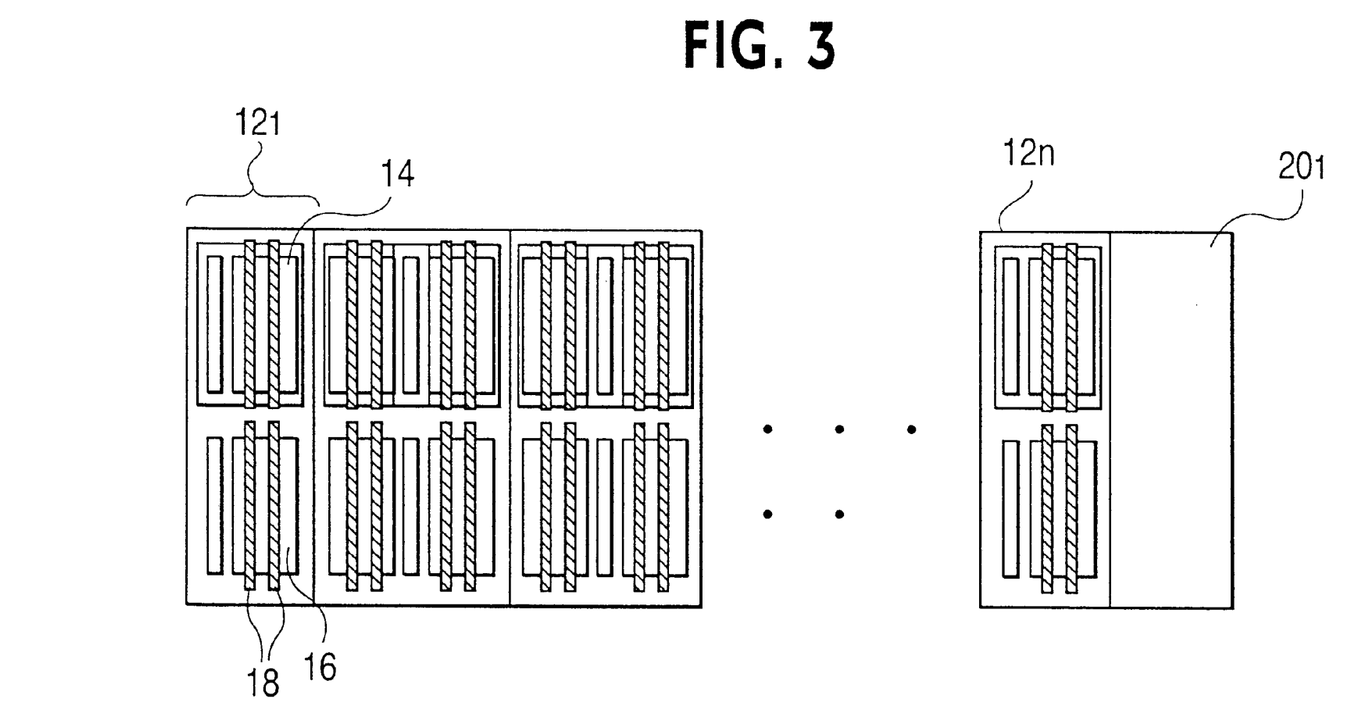
FIG. 3 is a partly enlarged view depicting the core area shown in FIG. 2.

FIG. 3 is a diagram showing, in an enlarged form, part of one row extending in the column direction of the core area 10 shown in FIG. 2. As shown in FIG. 3, unit cells $12_1$ through $12^n$ are lay out in the row direction of the core area 10A. The pull-up unit cell $20_1$ having the function of pulling up the on-rising level of a signal outputted to a signal line (not shown) is formed adjacent to the unit cell $12^n$ in the row direction of the core area 10A.

Since the unit cells $12_1$ through $12_n$ are respectively identical in configuration to each other, the unit cell $12_1$ will be explained. A P active or P active region 14 corresponding to a device area in which a PMOS transistor is formed, and an N active or N active region 16 corresponding to a device area in which an NMOS transistor is formed, are formed within the unit cell $12_1$ so as to adjoin each other in the column direction. The pair of polysilicon interconnections 18 and 18, which serve as gate regions, are formed in the column directions of the upper surfaces of the P active region 14 and the N active region 16. A P type diffused region and an N type diffused region are respectively formed on both sides of the P active region 14 and the N active region 16 with the pair of polysilicon interconnections 18 and 18 interposed therebetween, so that a pair of PMOS transistors are formed in the P active region 14 and a pair of NMOS transistors are formed in the N active region 16.

Figure 4:
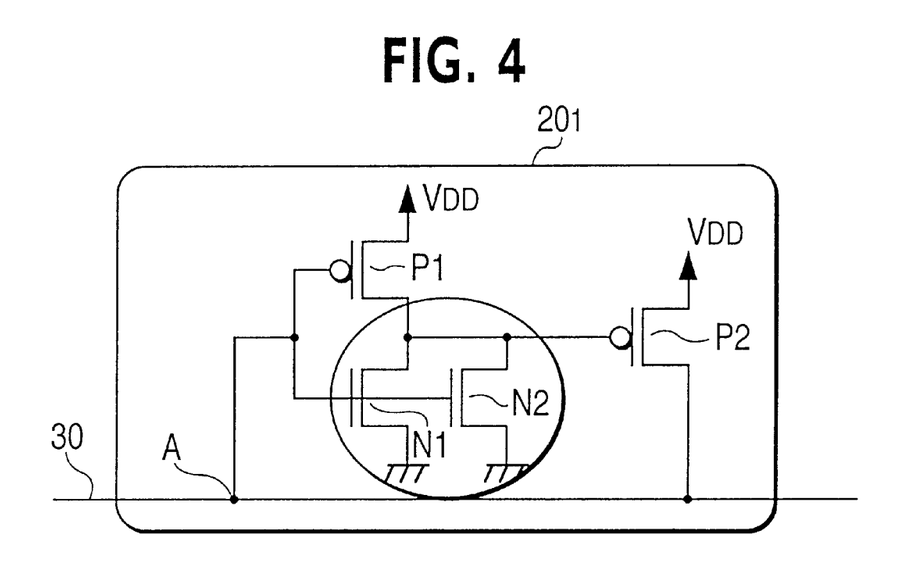
FIG. 4 is a circuit diagram showing one example of a circuit configuration of a pull-up unit cell.

Since the pull-up unit cells $20_1$, $20_2$, $20_3$, $20_i$, $20_{i+1}$, $20_{i+2}$, $20_j$, $20_{j+1}$, $20_{j+2}$, . . . are respectively of the same configuration, the pull-up unit cell $20_1$ will next be explained. One example of a circuit configuration of the pull-up unit cell $20_1$ is as shown in FIG. 4. In the same drawing, the pull-up unit cell $20_1$ has a CMOS inverter having a one-gate (one unit cell) configuration and composed of a PMOS transistor P1 and two NMOS transistors N1 and N2, and a PMOS transistor P2 whose gate is electrically connected to an output terminal of the CMOS inverter. The sources of the PMOS transistors P1 and P2 are electrically connected to a source voltage or power supply VDD, and the sources of the NMOS transistors N1 and N2 are grounded. A point of connection between the gate of the PMOS transistor P1 and the gate of the NMOS transistor N1, which serves as an input terminal of the CMOS inverter, and the drain of the PMOS transistor P2 are electrically connected to a clock signal line 30.

Thus, the clock signal line 30 and the input and output terminals of the pull-up unit cells $20_1$, $20_2$, $20_3$, $20_i$, $20_{i+1}$, $20_{i+2}$, $20^j$, $20_{j+1}$, $20_{j+2}$, . . . are electrically connected to one another at every point (each corresponding to a point A in FIG. 4) where the clock signal line 30 passes through upper portions of the pull-up unit cells $20_1$, $20_2$, $20_3$, $20_i$, $20_{i+1}$, $20^{i+2}$, $20_j$, $20_{j+1}$, $20_{j+2}$, . . . . The point A shown in FIG. 4 corresponds to each of contacts designated at numerals A in FIGS. 6 and 7 illustrative of the layout examples of the pull-up unit cells. Here, the dimensions of the device areas in which the NMOS transistors N1 and N2 are respectively formed over the pull-up unit cells $20_1$, $20_2$, $20_3$, $20_i$, $20_{i+1}$, $20_{i+2}$, $20_j$, $20_{j+1}$, $20_{j+2}$, . . . , are made greater than those of the device areas in which other PMOS transistors are formed.

Since the dimensions of the device area in which the NMOS transistors N1 and N2 constituting the CMOS inverter are formed, are set greater than those of the device area in which other PMOS transistors are formed, the time required for the NMOS transistors N1 and N2 to fall into conduction is shortened. Therefore, when a clock signal is outputted to the clock signal line 30 in the above-described configuration, the NMOS transistors N1 and N2 constituting the CMOS inverter are rapidly brought into conduction on the rising edge of the clock signal. Therefore, the PMOS transistor P2 electrically connected to the output terminal of the CMOS inverter is also rapidly brought into conduction. As a result, the potential of the clock signal line 30, i.e., the on-rising level of the clock signal is rapidly pulled up to the source voltage VDD, whereby the rise characteristic of the clock signal is improved as compared with that in the prior art.

Another example of the circuit configuration of each of the pull-up unit cells $20_1$, $20_2$, $20_3$, $20_i$, $20_{i+1}$, $20_{i+2}$, $20_j$, $20_{j+1}$, $20_{j+2}$, . . . will next be explained.

Figure 5:
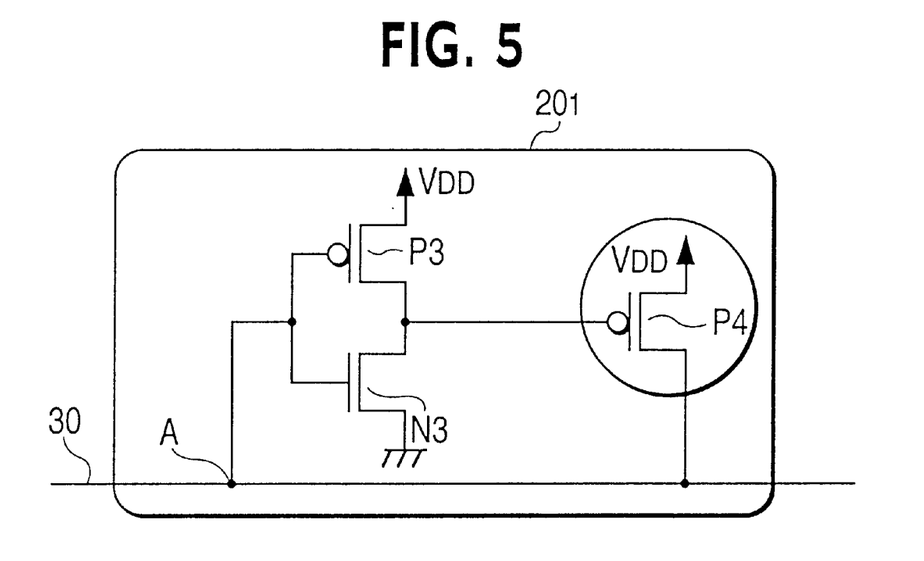
FIG. 5 is a circuit diagram illustrating another example of the circuit configuration of the pull-up unit cell.

Since the pull-up unit cells $20_1$, $20_2$, $20_3$, $20_i$, $20_{i+1}$, $20_{i+2}$, $20_j$, $20_{j+1}$, $20_{j+2}$, . . . are respectively of the same configuration, the pull-up unit cell $20_1$ will be described. Another example of the circuit configuration of the pull-up unit cell $20_1$ is as shown in FIG. 5. In the same drawing, the pull-up unit cell $20_1$ has a CMOS inverter having a one-gate (one unit cell) configuration and composed of a PMOS transistor P3 and an NMOS transistor N3, and a PMOS transistor P4 whose gate is electrically connected to an output terminal of the CMOS inverter. The sources of the PMOS transistors P3 and P4 are electrically connected to a source voltage or power supply VDD, and the source of the NMOS transistor N3 is grounded. A point of connection between the gate of the PMOS transistor P3 and the gate of the NMOS transistor N3, which serves as an input terminal of the CMOS inverter, and the drain of the PMOS transistor P4 are electrically connected to a clock signal line 30. In a manner similar to the circuit configuration shown in FIG. 4 even in the case of the present example, the clock signal line 30 and the input and output terminals of the pull-up unit cells $20_1$, $20_2$, $20_3$, $20_i$, $20_{i+1}$, $20_{i+2}$, $20_j$, $20_{j+i}$, $20_{j+2}$, . . . are electrically connected to one another at every point (each corresponding to a point A in FIG. 5) where the clock signal line 30 passes through upper portions of the pull-up unit cells $20_1$, $20_2$, $20_3$, $20_i$, $20_{i+1}$, $20_{i+2}$, $20_j$, $20_{j+1}$, $20_{j+2}$, . . . . The point A shown in FIG. 5 corresponds to a contact designated at numeral A in FIG. 8 illustrative of a layout example of a pull-up unit cell. Here, the dimensions of the device areas in which the PMOS transistors P4 each electrically connected to the output terminal of the CMOS inverter are respectively formed over the pull-up unit cells $20_1$, $20_2$, $20_3$, $20_i$, $20_{i+1}$, $20_{i+2}$, $20_j$, $20_{j+1}$, $20_{j+2}$, . . . , are made greater than those of the device areas in which NMOS transistors N3 constituting CMOS inverters preceding the above CMOS inverters are formed.

Figure 14A:
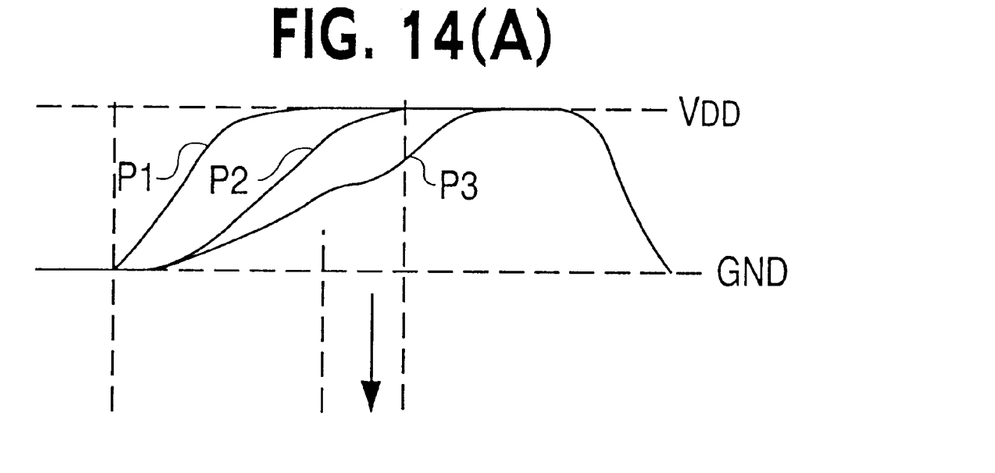
Figure 14B:
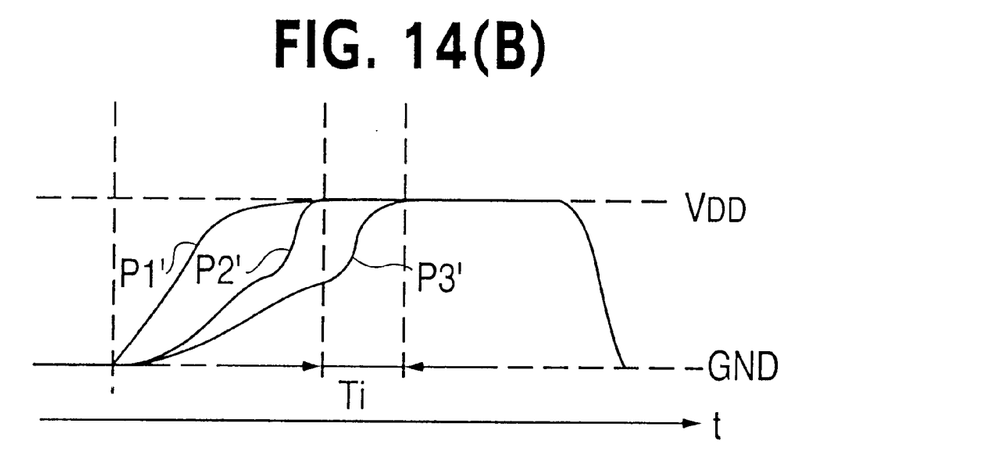

In the present embodiment, the dimensions of the device area in which the PMOS transistor P4 is formed, is set greater than those of the device area in which the NMOS transistor N3 constituting the CMOS inverter of the preceding stage is formed, under the above configuration. Therefore, when a clock signal is outputted to the clock signal line 30, the PMOS transistor P4 is rapidly brought into conduction in response to the output of the CMOS inverter upon the rising edge of the clock signal, so that the potential on the clock signal line 30, i.e., the on-rising level of the clock signal is rapidly pulled up to the source voltage VDD, whereby the rise characteristic of the clock signal is improved as compared with that in the prior art. This state is illustrated in FIG. 14. In FIG. 14(A), the waveform of a normal clock signal is defined as P1, and the waveforms of clock signals in a state in which loads different in magnitude are electrically connected to the clock signal line 30 are defined as P2 (low load) and P3 (high load) respectively. When these clock signals pass through the pull-up unit cell 20, the waveform P1 of the normal clock signal results in P1' as shown in FIG. 14(B) and hence virtually remains unchanged. However, the waveforms P2 and P3 of the clock signals whose rising edges become slow due to the fact that the loads are connected to the clock signals line, are pulled up to improve their rise characteristics, thus resulting in P2' and P3' respectively. In this case, the clock signals would lead to a solution of a delay in their reached time by a time interval Ti owing to the pull-up effect. Since the clock signals normally use the rise timing (positive edge) in most cases, only the rise characteristics may be improved in this case.

The layout example of the pull-up unit cell $20_1$ having the circuit configuration shown in FIG. 4 is shown in FIGS. 6 and 7, and the layout example of the pull-up unit cell $20_1$ having the circuit configuration shown in FIG. 5 is shown in FIG. 8, respectively. One example of a sectional structure of each unit cell will briefly be explained with reference to FIG. 9 prior to the description of the layout examples of these pull-up unit cells $20_1$. In FIG. 9, an N well 51 is formed in a surface layer of a silicon substrate 50. Further, N+ diffused layers 52, 54 and 60 and P+ diffused layers 56, 58 and 59 are formed in the vicinity of the surface of the silicon substrate 50. The N+ diffused layer 52 is a source region of an NMOS transistor, and the P+ diffused layer 58 is a source region of a PMOS transistor. The N+ diffused layer 54 is a drain region of the NMOS transistor, and the P+ diffused region 56 is a drain region of the PMOS transistor.

Polysilicon interconnections 62 and 62, which constitute gates, are respectively formed between the N+ diffused layers 52 and 54 and between the P+ diffused layers 56 and 58. The N+ diffused layer 52, the P+ diffused layer 58 and the N+ diffused layer 60 are respectively electrically connected to a first layer metal interconnection 66 supplied with the source voltage VDD, which is formed above with conductive films 64 interposed therebetween.

The P+ diffused layer 59 is set to a ground potential. Further, an interlayer insulating film 68 is formed between the upper surface of the silicon substrate 50 and the first layer metal interconnection 66.

A second layer metal interconnection 72 is formed above the first layer metal interconnection 66 with an interlayer insulating film 70 interposed therebetween. First through holes 74 are defined between the first layer metal interconnection 66 and the second layer metal interconnection 72.

Figure 10:
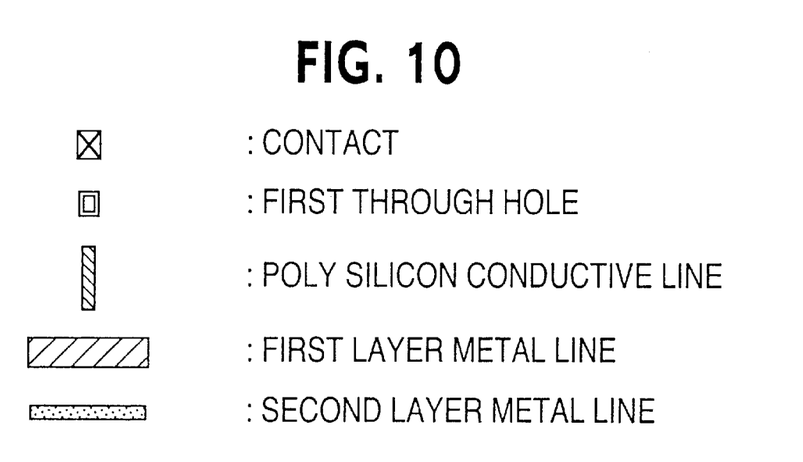
FIG. 10 is an explanatory view showing the correspondence of symbols used to illustrate layout examples of pull-up unit cells and pull-up/pull-down unit cells and their meaning.

FIG. 10 shows the correspondence of symbols used to illustrate the layout examples of the pull-up unit cells and pull-up/pull-down unit cells and their meaning. A description will next be made of FIGS. 6 and 7 each illustrative of the layout example of the pull-up unit cell $20_1$ having the circuit configuration shown in FIG. 4.

Figures 6A, 6B:
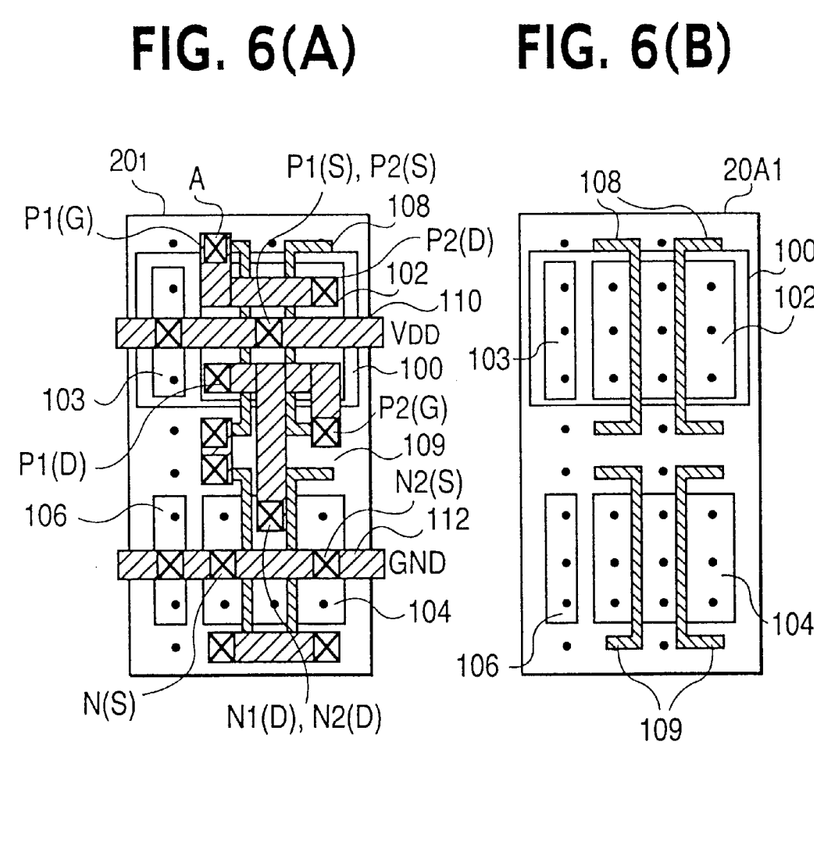

FIG. 6(A) shows the pull-up unit cell $20_1$ shown in FIG. 4, which is constructed by employing first layer metal interconnections in the conventional unit cell. FIG. 6(B) illustrates the layout of a conventional unit cell 20A1. In the same drawing, a P active or P active region 102 corresponding to a device area in which P diffused layers used as the sources and drains of PMOS transistors P1 and P2 are formed, and an N active or N active region 103 supplied with the source voltage and having N diffused layers formed therein are provided within an N well 100 formed over a silicon substrate. A pair of polysilicon interconnections 108 and 108 is formed over the P active region 102, and one pair of PMOS transistors P1 and P2 is formed thereon with the pair of polysilicon interconnections 108 and 108 as gates respectively.

Further, an N active or N active region 104 corresponding to a device area in which N diffused layers used as the sources and drains of NMOS transistors N1 and N2, and a P active or P active region 106 supplied with a ground potential and having P diffused layers formed therein are provided over the silicon substrate. A pair of polysilicon interconnections 109 and 109 are formed over the N active region 104, and the pair of NMOS transistors N1 and N2 are formed thereon with the pair of polysilicon interconnections 109 and 109 as gates respectively.

Figure 6C:
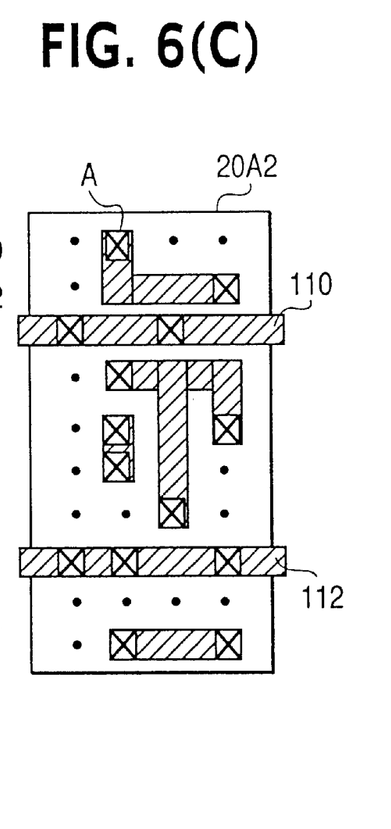

The conventional unit cell 20A1 constructed in this manner is given a wiring pattern 20A2 using first layer metal interconnections shown in FIG. 6(C) to thereby obtain the layout drawing shown in FIG. 6(A). In FIG. 6(A), contacts respectively electrically connected to the source, drain, gate of the PMOS transistor P1 are respectively shown as P1 (S), P1 (D) and P1 (G), contacts respectively electrically connected to the source, drain and gate of the PMOS transistor P2 are respectively shown as P2(S), P2(D) and P2(G), contacts respectively electrically connected to the source, drain and gate of the NMOS transistor N1 are respectively shown as N1 (S), N1 (D) and N1 (G), and contacts respectively electrically connected to the source, drain and gate of the NMOS transistor N2 are respectively shown as N2(S), N2(D) and N2(G).

In FIG. 6(C), the diagonally-shaded areas show the first layer metal interconnections as shown in FIG. 10. Of these, the first layer metal interconnection 110 corresponds to a source (VDD) line, and the first layer metal interconnection 112 corresponds to a ground (GND) line.

Figure 7A:
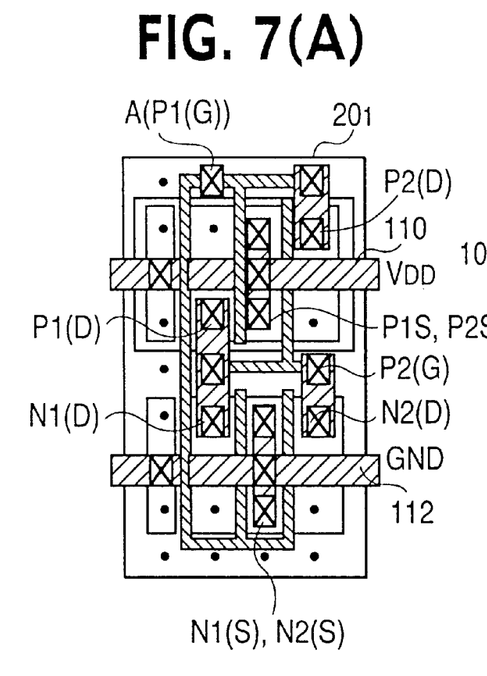
Figure 7B:
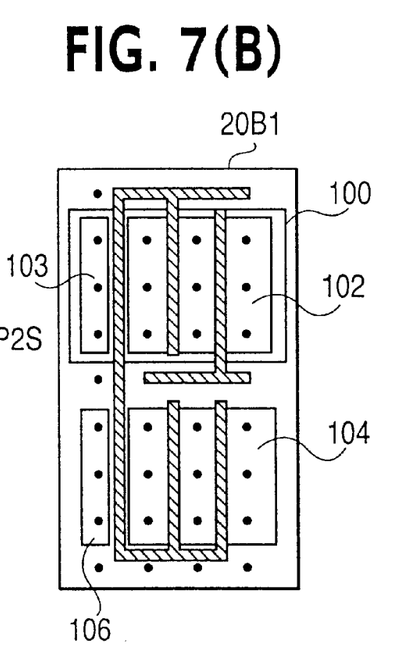
Figure 7C:
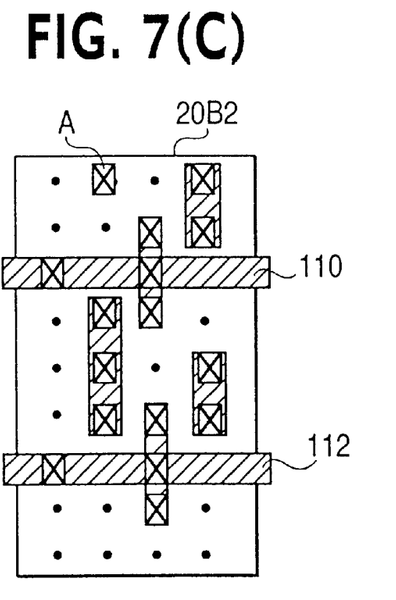

Another layout example of the pull-up unit cell $20_1$ shown in FIG. 4 according to the first embodiment will next be explained with reference to FIG. 7. FIG. 7(A) shows the pull-up unit cell $20_1$ shown in FIG. 4, which is constructed by using polysilicon interconnections each corresponding to a lower wiring layer and first layer metal interconnections each corresponding to a wiring layer thereabove in the conventional unit cell. FIG. 7(B) illustrates a unit cell 20B1 in which wiring patterns for polysilicon interconnections are changed in the conventional unit cell 20A1 so that some of the interconnections using the first layer interconnections illustrated in the layout example of FIG. 6 is formed by the polysilicon interconnection. In the layout example of FIG. 6 specifically by way of example, the gates of the NMOS transistors N1 and N2 are connected in common with each other, and the interconnection for electrically connecting the gate of the PMOS transistor P1 and the drain of the PMOS transistor P2 and the interconnection for electrically connecting the gate of the PMOS transistor P2 and the drain of the PMOS transistor P1 are laid out so as to be formed by the first layer metal interconnections. In the unit cell shown in FIG. 7(B), however, these interconnections are laid out so as to be formed of the polysilicon interconnection. A wiring pattern 20B2 using first layer metal interconnections shown in FIG. 7(C) is applied to the unit cell shown in FIG. 7(B) to thereby obtain the layout drawing shown in FIG. 7(A). In FIG. 7(A), contacts respectively electrically connected to the source, drain, gate of a PMOS transistor P1 are respectively shown as P1 (S), P1 (D) and P1 (G), contacts respectively electrically connected to the source, drain and gate of a PMOS transistor P2 are respectively shown as P2(S), P2(D) and P2(G), contacts respectively electrically connected to the source, drain and gate of an NMOS transistor N1 are respectively shown as N1(S), N1(D) and N1(G), and contacts respectively electrically connected to the source, drain and gate of an NMOS transistor N2 are respectively shown as N2(S), N2(D) and N2(G).

Since part of the wiring pattern for the upper wiring layer makes use of the polysilicon interconnection corresponding to the lower wiring layer, the present layout example can improve the efficiency of use of the upper metal wiring layer as compared with the layout example shown in FIG. 6(A).

The layout example of the pull-up unit cell $20_1$ shown in FIG. 5, according to the first embodiment will next be explained with reference to FIG. 8.

Figures 8A, 8B:
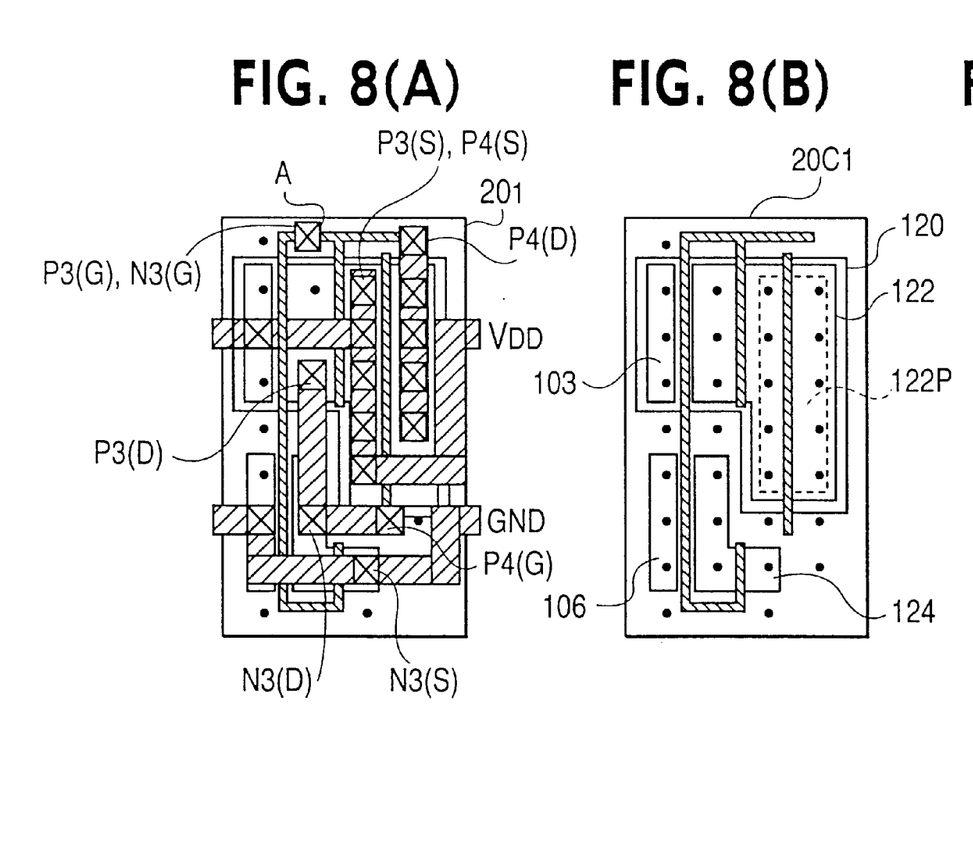
FIGS. 8A–8C is an explanatory view illustrating one example of the layout of the pull-up unit cel aving the circuit configuration shown in FIG. 4.
Figure 9:
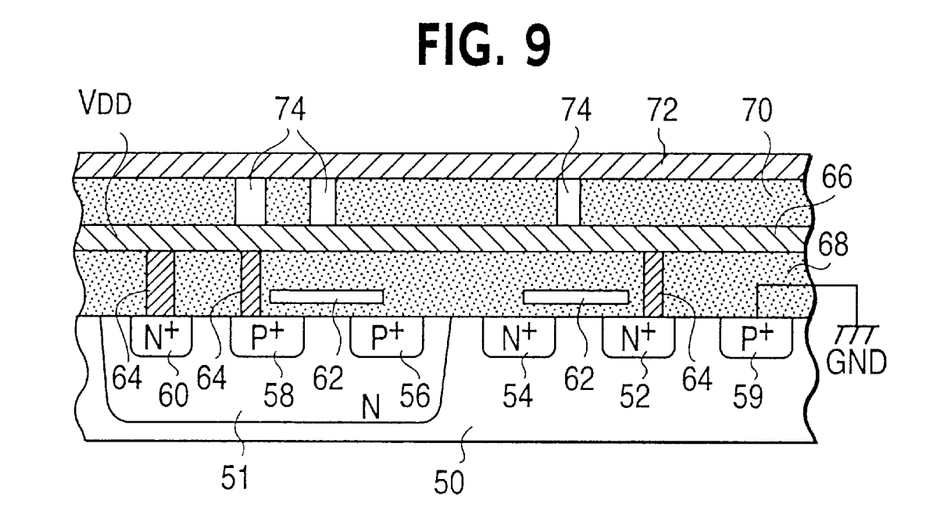
FIG. 9 is a cross-sectional view depicting one example of a sectional structure of each unit cell.

FIG. 8(A) illustrative of the layout example according to the present embodiment shows a layout example in which in the conventional unit cell, the number of the NMOS transistors constituting the CMOS inverter is reduced by one and the dimensions of the device area for the PMOS transistor P4 are set greater than those of the device area for the formation of the NMOS transistor N3 of the CMOS inverter so as to improve drive capacity of the pull-up PMOS transistor P4 connected to the stage next to the CMOS inverter through the use of the device area corresponding to the reduced NMOS transistor.

FIG. 8(B) shows a unit cell 20C1 in which the number of the NMOS transistors employed in the unit cell 20B1 shown in FIG. 7(B) is reduced so that the N active region 104 formed with the NMOS transistors is scaled down as an N active or N active region 124, the dimensions of the device area in which the pull-up PMOS transistor P4 connected to the output terminal of the CMOS inverter is formed, are made greater so that the P active region 102 with the PMOS transistors formed therein is taken as a P active or P active region 122, and the wiring pattern using the polysilicon interconnections is changed with the change of the circuit from FIG. 4 to FIG. 5. An area 122P indicated by a broken line in FIG. 8(B) shows an area in which a pull-up PMOS transistor P4 is formed.

Reference numeral 120 indicates an N well.

Figure 8C:
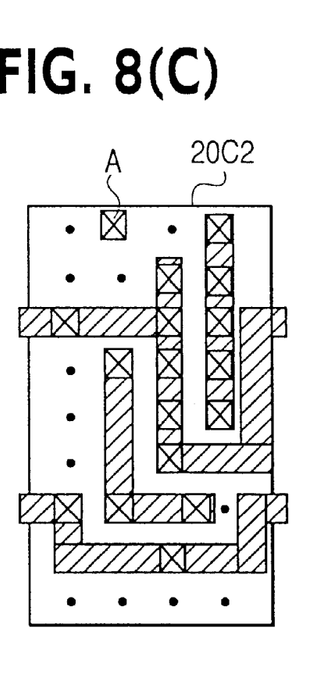

A wiring pattern 20C2 using first layer metal interconnections, which is shown in FIG. 8(C), is applied to the unit cell 20C1 shown in FIG. 8(B) to thereby obtain the layout drawing shown in FIG. 8(A). In FIG. 8(A), contacts respectively electrically connected to the source, drain, gate of a PMOS transistor P3 are respectively shown as P3(S), P3(D) and P3(G), contacts respectively electrically connected to the source, drain and gate of a PMOS transistor P4 are respectively shown as P4(S), P4(D) and P4(G), and contacts respectively electrically connected to the source, drain and gate of an NMOS transistor N3 are respectively shown as N3(S), N3(D) and N3(G).

According to the semiconductor integrated circuit device according to the first embodiment of the present invention as described above, the rise characteristic of the signal can be improved. It is therefore possible to solve a delay in the time required to transfer the signal between the unit cells.

A semiconductor integrated circuit device according to a second embodiment of the present invention will be explained with reference to FIGS. 10 through 12. The semiconductor integrated circuit device according to the second embodiment is different in configuration from the semiconductor integrated circuit device according to the first embodiment in that in the semiconductor integrated circuit device wherein unit cells having basic circuits formed therein including PMOS and NMOS transistors are formed in a core area of a semiconductor chip in row and column form, pull-up/pull-down unit cells each having the function of pulling up the on-rising level of a signal outputted to a signal line and pulling down the on-falling level thereof are formed so as to be placed at predetermined intervals in row and column directions.

Figure 11:
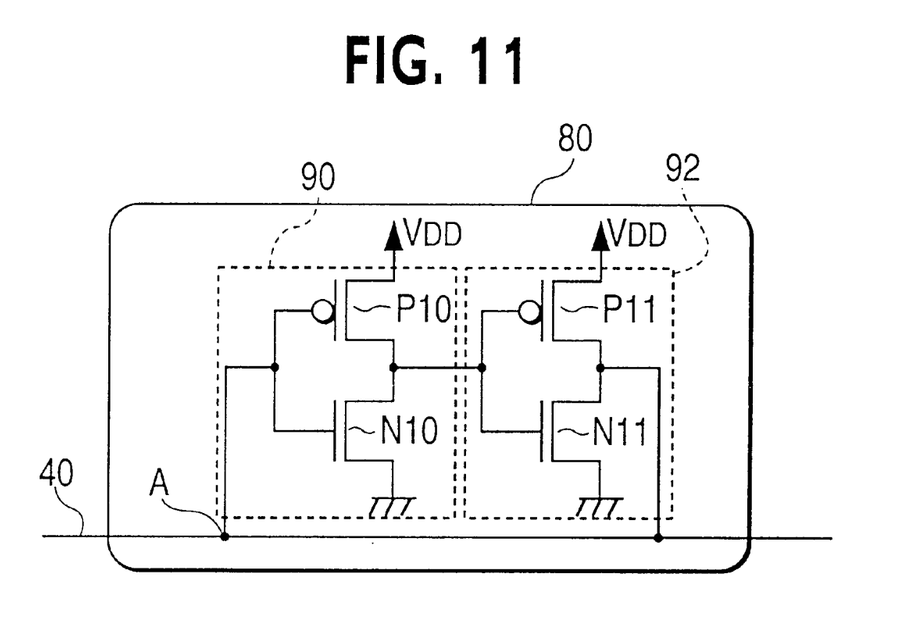
FIG. 11 is a circuit diagram illustrating one example of a circuit configurations pull-up/pull-down unit cell.

A circuit configuration of a pull-up/pull-down unit cell is shown in FIG. 11.

In the same drawing, the pull-up/pull-down unit cell 80 has a first CMOS inverter 90 having a one-gate (one unit cell) configuration and comprised of a PMOS transistor P10 and an NMOS transistor N10, and a second CMOS inverter 92 comprised of a PMOS transistor P11 and an NMOS transistor N11. These first and second CMOS inverters 90 and 92 are electrically connected in tandem. An input terminal of the first CMOS inverter 90 and an output terminal of the second CMOS inverter 92 are electrically connected to a data signal line 40. The sources of the PMOS transistors P10 and P11 are electrically connected to a source voltage VDD, and the sources of the NMOS transistors N10 and N11 are grounded. Thus, the data signal line 40 and the input and output terminals of the pull-up/pull-down unit cells 80 are electrically connected to one another at every point (each corresponding to a point A in FIG. 11) where the data signal line 40 passes through upper portions of the pull-up/pull-down unit cells 80. The point A shown in FIG. 11 corresponds to each of contacts designated at numerals A in FIGS. 12 and 13 illustrative of layout examples. Incidentally, the data signal line 40 makes use of only a metal interconnection corresponding to the top layer because the wiring length thereof is apt to become long and the data signal line 40 is electrically connected to a first layer metal interconnection alone.

When a data signal is outputted to the data signal line 40 in the above-described configuration, the PMOS transistor P10 is brought into non-conduction and the NMOS transistor N10 is brought into conduction upon the rising edge of the data signal. Therefore, the output of the first CMOS inverter 90 changes from a high level to a low level. As a result, the PMOS transistor P11 is brought into conduction and the NMOS transistor N1 is brought into non-conduction. Thus, the potential on the data signal line 40, i.e., the on-rising level of the data signal is pulled up to the source voltage VDD.

Since the PMOS transistor P10 and the NMOS transistor N10 are respectively brought into conduction and non-conduction upon the falling edge of the data signal, the output of the first CMOS inverter 90 changes from a low to a high levels, so that the PMOS transistor P11 is brought into non-conduction and the NMOS transistor Ni 1 is brought into conduction. Thus, the potential on the data signal line 40, i.e., the on-falling level of the data signal is pulled down to a ground level.

Figure 15A:
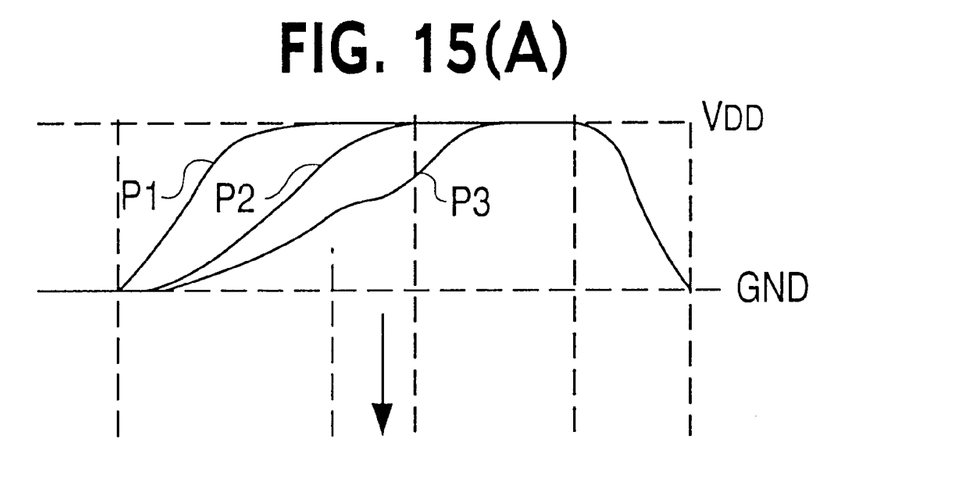
Figure 15B:
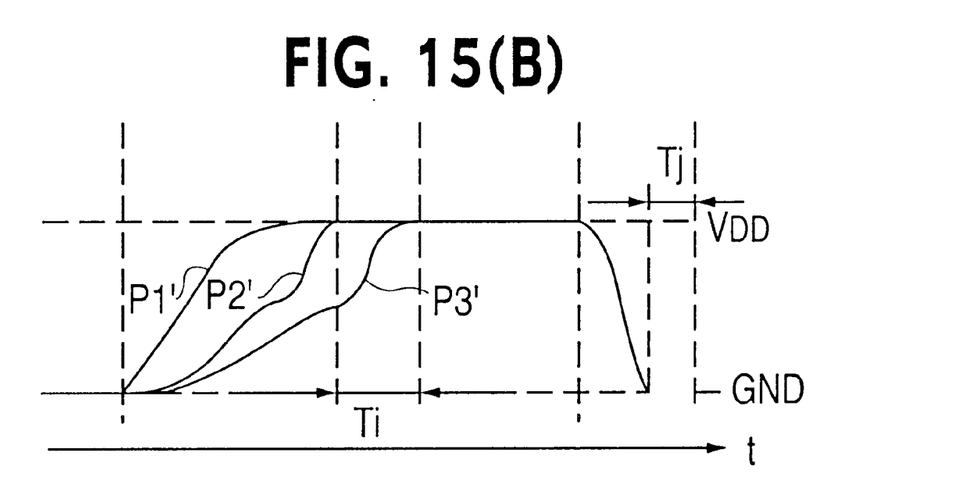

An effect obtained by allowing the data signal to pass through the pull-up/pull-down unit cell 80 will be explained with reference to FIG. 15. In FIG. 15(A), the waveform of a normal data signal is defined as P1, and the waveforms of data signals in a state in which loads different in magnitude are electrically connected to the data signal line 40, are defined as P2 (low load) and P3 (high load) respectively. When these data signals pass through the pull-up/pull-down unit cell 80, the waveform P1 of the normal data signal results in P1' as shown in FIG. 15(B) and hence virtually remains unchanged. However, the waveforms P2 and P3 of the data signals whose rising edges become slow due to the fact that the loads are connected to the data signals line, are pulled up to steepen their rising edges. Further, they are pulled down upon their falling edges so as to fall abruptly. As a result, the rise and fall characteristic of the data signals are improved so that their waveforms become P2' and P3'. In this case, the time required to transfer each data signal between the unit cells is shortened by a time interval Ti upon rising owing to the pull-up effect, whereas upon falling, the time is reduced by a time interval Tj owing to the pull-down effect, whereby delays in signal transfer time are resolved. While the timing provided to allow the data signals to rise and fall need to be accurate in terms of the operation, the rise and fall characteristics of the data signals are improved by connecting the data signal line and the input and output terminals of the pull-up/pull-down unit cell 80 in this way. It is therefore possible to solve the delay in the time required to transfer each data signal between the unit cells.

Figures 12A, 12B:
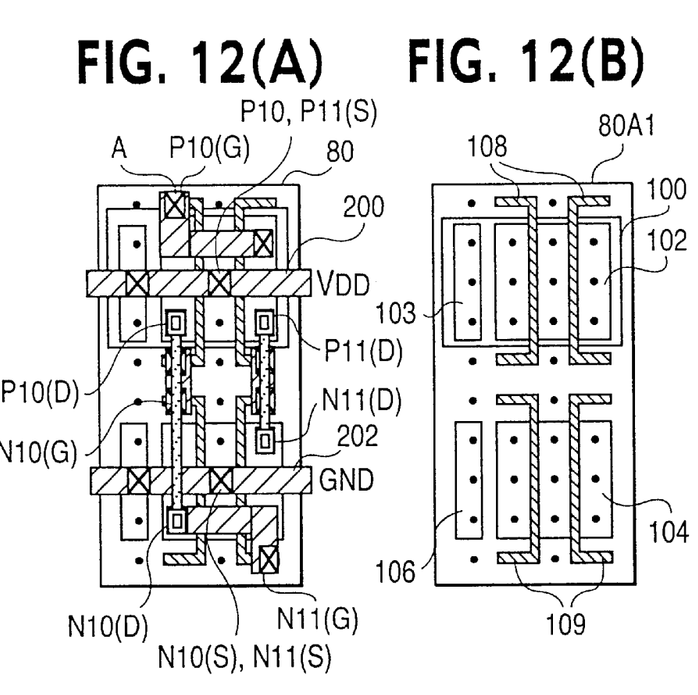
Figure 12C:
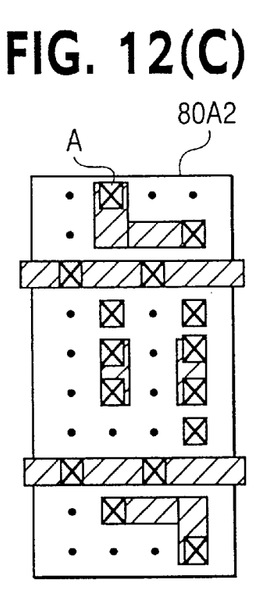
Figure 12D:
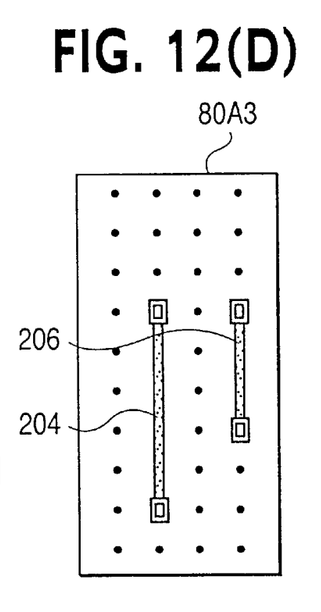

The layout example of the pull-up/pull-down unit cell 80 shown in FIG. 11, according to the second embodiment is next shown in FIGS. 12 and 13. FIG. 12(A) shows the pull-up/pull-down unit cell 80 shown in FIG. 11, which is constructed by using first layer metal interconnections and second layer interconnections in a conventional unit cell. FIG. 12(B) shows the layout of a conventional unit cell 80A1. Since it is the same as the conventional unit cell 20A1 shown in FIG. 6(B), the description of certain common elements will be omitted. A wiring pattern 80A2 shown in FIG. 12(C) using the first layer metal interconnections is applied to a pattern for the conventional unit cell 80A1 shown in FIG. 12(B), and a wiring pattern 80A3 shown in FIG. 12(D) using second layer metal interconnections 204 and 206 located above the first layer metal interconnections is further applied thereto, thereby obtaining the layout drawing shown in FIG. 12(A). In FIG. 12(C), the first layer metal interconnection 200 corresponds to a source (VDD) line and the first layer metal interconnection 20$_2$ corresponds to a ground (GND) line.

Figures 13A, 13B:
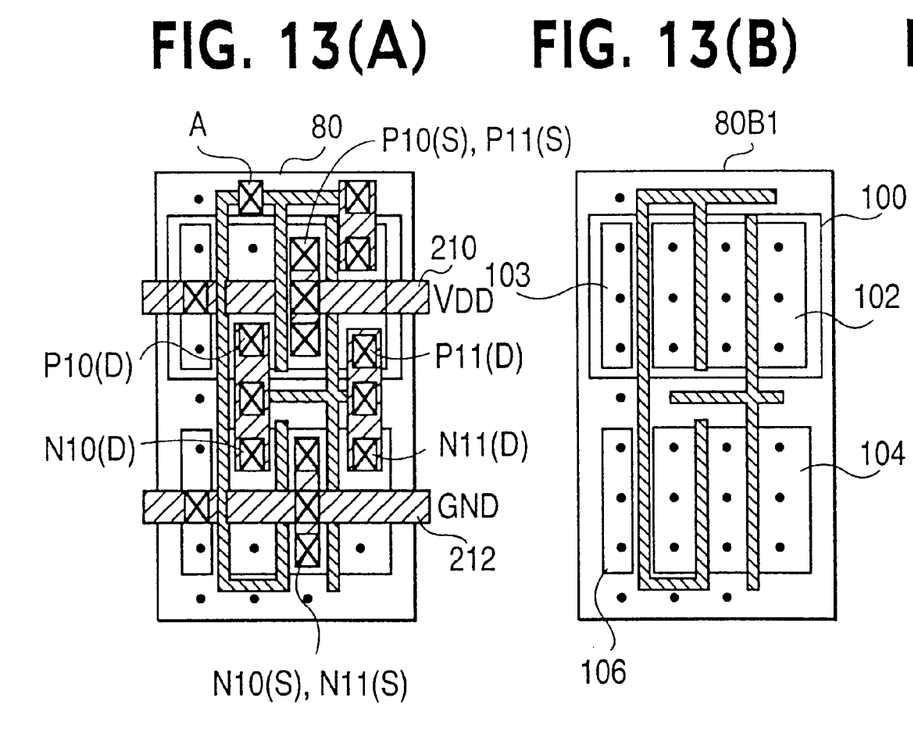

FIG. 13(A) shows the layout of the pull-up/pull-down unit cell 80 shown in FIG. 11 constructed by using polysilicon wiring layers corresponding to lower wiring layers and first layer metal interconnections corresponding to wiring layers thereabove in the conventional unit cell.

Figure 13C:
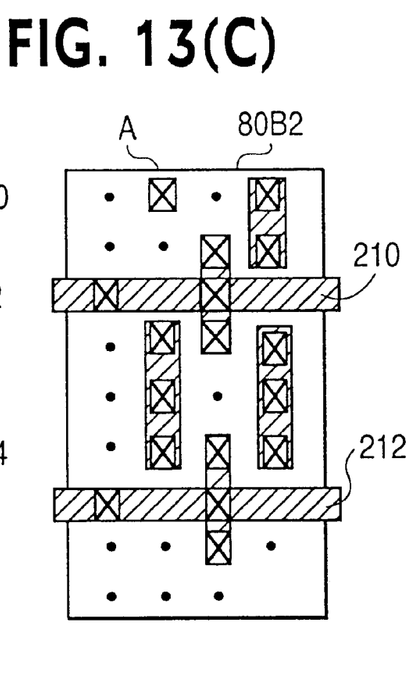

FIG. 13(B) shows a unit cell 80B1 in which wiring patterns using polysilicon interconnections are changed in the conventional unit cell 80A1 so that some of the interconnections using the first layer interconnections illustrated in the layout example of FIG. 12 is formed by the polysilicon interconnection. The unit cell 80B1 is given a wiring pattern 80B2 shown in FIG. 13(C) using first layer metal interconnections to thereby obtain the layout drawing shown in FIG. 13(A). In FIG. 13(C), the first layer metal interconnection 210 corresponds to a source (VDD) line, and the first layer metal interconnection 212 corresponds to a ground (GND) line.

Since some of the wiring pattern corresponding to the upper wiring layer makes use of the polysilicon interconnection corresponding to the lower wiring layer, the present layout example can provide an improvement in the efficiency of use of the upper metal wiring layer as compared with the layout example shown in FIG. 12(A). In FIGS. 12(A) and 13(A), contacts respectively electrically connected to the source, drain, gate of PMOS transistors P10 are respectively shown as P10(S), P10(D) and P10(G), contacts respectively electrically connected to the source, drain and gate of PMOS transistor P11 are respectively shown as P11 (S), P11 (D) and P11 (G), contacts respectively electrically connected to the source, drain and gate of NMOS transistors N10 are respectively shown as N10(S), N10(D) and N10(G), and contacts respectively electrically connected to the source, drain and gate of NMOS transistors N11 are respectively shown as N11(S), N11(D) and N11(G).

According to the semiconductor integrated circuit device according to the second embodiment of the present invention as described above, since the pull-up/pull-down unit cells each having the effect of pulling up the on-rising level of the signal outputted to the signal line and pulling down the on-falling level thereof pull-up/pull-down unit cells are formed so as to be placed at predetermined intervals in the row and column directions of the core area, aside from the unit cells with the basic circuits formed therein, so that the rise and fall characteristics of the signal can be improved. Therefore, a delay in the time required to cause the signal to reach between the unit cells can be resolved.

According to the invention as described in the first embodiment, as has been described above, since the pull-up unit cells each having the effect of pulling up the on-rising level of the signal outputted to the signal line are formed so as to be placed at predetermined intervals in the row and column directions of the core area of the semiconductor chip, aside from the unit cells having the basic circuits formed therein including the PMOS and NMOS transistors, the rise characteristic of the signal can be improved. Therefore, a delay in the time required to transfer the signal between the unit cells can be resolved.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A semiconductor integrated circuit having a core region and an I/O region, the semiconductor integrated circuit comprising:
    a clock signal line that transfers a clock signal;
    a plurality of basic unit cells arranged in rows and columns within the core region, each of said basic unit cells having a PMOS active region and an NMOS active region; and
    a plurality of pull-up unit cells arranged at predetermined intervals between said basic unit cells, said pull-up unit cells being coupled to said clock signal line to pull up an electric level of said clock signal line in response to the clock signal.

2. The semiconductor integrated circuit according to claim 1, wherein each of said pull-up unit cells comprises:
    an inverter circuit having an input coupled to said clock signal line, a PMOS transistor, an NMOS transistor and an output; and
    a pull-up PMOS transistor having a gate coupled to the output of said inverter circuit, a source coupled to a voltage source and a drain coupled to said clock signal line.

3. The semiconductor integrated circuit according to claim 2, wherein the NMOS transistor of said inverter circuit has a larger dimension than a dimension of said pull-up PMOS transistor.

4. The semiconductor integrated circuit according to claim 2, wherein the NMOS transistor of said inverter circuit comprises a plurality of transistors coupled in parallel.

5. The semiconductor integrated circuit according to claim 2, wherein said pull-up PMOS transistor has a larger dimension than a dimension of the NMOS transistor of said inverter circuit.

6. The semiconductor integrated circuit according to claim 1, wherein each of said pull-up unit cells includes the PMOS active region as having a larger area than an area of the NMOS active region, so that a PMOS transistor formed on the PMOS active area has a larger dimension than a dimension of an NMOS transistor formed on the NMOS active area.

7. The semiconductor integrated circuit according to claim 1, wherein each of said pull-up unit cells comprises;
    a first inverter circuit having an input coupled to said clock signal line, a first PMOS transistor, a first NMOS transistor and an output; and
    a second inverter circuit having an input coupled to the output of said first inverter circuit, a second PMOS transistor, a second NMOS transistor and an output coupled to said clock signal line.

8. A semiconductor integrated circuit having a core region and an I/O region, the semiconductor integrated circuit comprising:

a clock signal line that transfers a clock signal; and a plurality of unit cells arranged in rows and columns within the core region, each of said unit cells having a PMOS active region and an NMOS active region, said unit cells also including a plurality of basic unit cells and a plurality of pull-up unit cells arranged at predetermined intervals between said basic unit cells, said pull-up unit cells being coupled to said signal line to pull up an electric level of said clock signal line in response to the clock signal.

9. The semiconductor integrated circuit according to claim 8, wherein each of said each of pull-up unit cells comprises;

an inverter circuit having an input coupled to said clock signal line, a PMOS transistor, an NMOS transistor and an output; and a pull-up PMOS transistor having a gate coupled to the output of said inverter circuit, a source coupled to a voltage source and a drain coupled to said clock signal line.

10. The semiconductor integrated circuit according to claim 9, wherein the NMOS transistor of said inverter circuit has a larger dimension than a dimension of said pull-up PMOS transistor.

11. The semiconductor integrated circuit according to claim 10, wherein the NMOS transistor of said inverter circuit comprises a plurality of transistors coupled in parallel.

12. The semiconductor integrated circuit according to claim 9, wherein said pull-up PMOS transistor has a larger dimension than a dimension of the NMOS transistor of said inverter circuit.

13. The semiconductor integrated circuit according to claim 8, wherein each of said pull-up unit cells comprises:

first inverter circuit having an input coupled to said clock signal line, a first PMOS transistor, a first NMOS transistor and an output; and a second inverter circuit having an input coupled to the output of said first inverter circuit, a second PMOS transistor, a second NMOS transistor and an output coupled to said clock signal line.

14. A method of designing a semiconductor integrated circuit having core region including unit cells arranged in rows and columns and an I/O region, each of the unit cells having a PMOS active region and an NMOS active region, the method comprising:

positioning a clock signal line for transferring a clock signal from the I/O region to the core region;

providing a plurality of pull-up unit cells among the unit cells, the pull-up unit cells being located near the clock signal line predetermined intervals with respect to each other; and providing a plurality of pull-up circuits within the pull-up unit cells.

15. The method of designing a semiconductor integrated circuit according to claim 14, wherein said providing the pull-up unit cells comprises:

providing an inverter circuit having an input coupled to said clock signal line, a PMOS transistor, an NMOS transistor and an output; and providing a pull-up PMOS transistor having a gate coupled to the output of said inverter circuit, a source coupled to a voltage source and a drain coupled to said clock signal line.

16. The semiconductor integrated circuit according to claim 15, wherein the NMOS transistor of said inverter circuit has a larger dimension than a dimension of said pull-up PMOS transistor.

17. The semiconductor integrated circuit according to claim 16, wherein the NMOS transistor of said inverter circuit comprises a plurality of transistors coupled in parallel.

18. The semiconductor integrated circuit according to claim 15, wherein said pull-up PMOS transistor has a larger dimension than a dimension of the NMOS transistor of said inverter circuit.

19. The semiconductor integrated circuit according to claim 14, wherein said providing the pull-up unit cells comprises:

providing a first inverter circuit having an input coupled to said clock signal line, a first PMOS transistor, a first NMOS transistor and an output; and providing a second inverter circuit having an input coupled to the output of said first inverter circuit, a second PMOS transistor, a second NMOS transistor and an output coupled to said clock signal line.

20. The method of designing a semiconductor integrated circuit according to claim 14, wherein the pull-up circuits pull up an electric level of said clock signal line in response to the clock signal.

* * * * *